United States Patent
Tsai et al.

(10) Patent No.: US 6,767,800 B1
(45) Date of Patent: Jul. 27, 2004

(54) PROCESS FOR INTEGRATING ALIGNMENT MARK AND TRENCH DEVICE

(75) Inventors: Tzu-Ching Tsai, Taoyuan (TW); Liang-Hsin Chen, Kaohsiung (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/628,952

(22) Filed: Jul. 28, 2003

(30) Foreign Application Priority Data

Mar. 19, 2003 (TW) ........................................ 92106068 A

(51) Int. Cl.[7] .............................................. H01L 21/20
(52) U.S. Cl. ........................ 438/401; 438/975; 438/427; 438/243; 438/386; 257/797
(58) Field of Search ................................ 438/401, 975, 438/427, 243–249, 386–392; 257/797

(56) References Cited

U.S. PATENT DOCUMENTS

| | | | | |
|---|---|---|---|---|
| 5,889,335 A | * | 3/1999 | Kuroi et al. ................. | 257/797 |
| 5,893,744 A | * | 4/1999 | Wang ......................... | 438/401 |
| 6,043,133 A | * | 3/2000 | Jang et al. .................. | 438/401 |
| 6,049,137 A | * | 4/2000 | Jang et al. .................. | 257/797 |
| 6,100,158 A | * | 8/2000 | Lee et al. ................... | 438/401 |
| 6,218,262 B1 | * | 4/2001 | Kuroi et al. ................. | 438/401 |
| 6,218,266 B1 | * | 4/2001 | Sato et al. .................. | 438/427 |
| 6,303,460 B1 | * | 10/2001 | Iwamatsu .................... | 438/401 |
| 6,440,816 B1 | * | 8/2002 | Farrow et al. ............... | 438/401 |
| 2002/0192926 A1 | * | 12/2002 | Schroeder et al. .......... | 438/401 |

FOREIGN PATENT DOCUMENTS

JP 2002134701 A * 5/2002 ........... H01L/27/08

* cited by examiner

Primary Examiner—John F. Niebling
Assistant Examiner—Jennifer M. Kennedy
(74) Attorney, Agent, or Firm—Quintero Law Office

(57) ABSTRACT

A process for integrating an alignment mark and a trench device. A substrate having first and second trenches is provided. The second trench is used as the alignment mark having a width larger than the first trench. The trench device is formed in each of the low portion of the first and second trenches, and then a first conductive layer is formed on the trench device in each of the first and second trenches. A second conductive layer is formed overlying the substrate and fills in the first trench and is simultaneously and conformably formed over the inner surface of the second trench. The second conductive layer and a portion of the first conductive layer in the second trench are removed and simultaneously leave a portion of the second conductive layer in the first trench by the etch back process.

17 Claims, 5 Drawing Sheets

PROCESS FOR INTEGRATING ALIGNMENT MARK AND TRENCH DEVICE

BACKGROUND OF THE INVENTION

1. Field of the Invention

The present invention relates in general to a semiconductor process. More particularly, it relates to a simplified process for integrating an alignment mark and a trench device to reduce fabrication cost.

2. Description of the Related Art

Lithography is one of most important processes for fabricating semiconductor integrated circuits. Lithography is used in the transfer of a pattern onto a thin film or the fabrication of a mask for ion implantation. In general, lithography is conducted many times in the production of is semiconductor circuits. In a lithography step, however, one critical factor is pattern alignment. When a wafer is processed to form patterns in the different thin films deposited thereon, the wafer must be properly aligned relative to the previous pattern. Conventionally, an alignment mark (AM) is used for alignment before carrying out photo-exposure.

In general, alignment marks are formed outside the device region, such as the scribe line of a wafer, at the same time as a thin film such as an insulating layer or a conductive layer is patterned. FIGS. 1a to 1d are cross-sections showing a conventional process for integrating an alignment mark and a trench device. First, in FIG. 1a, a substrate 100, such as a silicon wafer, is provided. The substrate 100 has a device region 10 and an alignment mark region 20 which is at the scribe line of the wafer 100.

Next, a patterned masking layer 105 is formed on the substrate 100. The patterned masking layer 105 can be composed of a pad oxide layer 102 and a thicker overlying silicon nitride layer 104. Next, the substrate 100 is etched using the patterned masking layer 105 as an etch mask to form deep trenches 110a and 110b therein. The deep trench 110a is on the device region 10 and the trench 110b having a width larger than the deep trench 110a is on the alignment mark region 20.

Next, trench capacitors 118a and 118b are respectively formed in the lower portion of the deep trenches 110a and 110b. The trench capacitor 118a includes a top plate 116a, a capacitor dielectric layer 114a, and a bottom plate 112a. Also, the trench capacitor 118b includes a top plate 116b, a capacitor dielectric layer 114b, and a bottom plate 112b. Next, collar insulating layers 117a and 117b are respectively formed on the trench capacitors 118a and 118b and over the sidewall of the deep trenches 110a and 110b. Thereafter, conductive layers 120a and 120b, such as polysilicon, are respectively formed in the deep trenches 110a and 110b, which have a height substantially equal to the collar insulating layers 117a and 117b.

Next, a conductive layer 122, such as polysilicon, is formed on the masking layer 105 and fills in the deep trenches 110a and 110b.

Next, in FIG. 1b, chemical mechanical polishing (CMP) is performed on the conductive layer 122 to respectively leave a portion of the conductive layers 122a and 122b in the deep trenches 110a and 110b.

Next, in FIG. 1c, the conductive layers 122a and 122b are etched to leave a portion of the conductive layers 124a and 124b in the deep trenches 110a and 110b, respectively. The conductive layer 120a and the remaining conductive layer 124a in the deep trench 110a are used as a wiring layer for the trench capacitor 118a. In addition, the trench capacitor 118b, the conductive layer 120b, and the remaining conductive layer 124b are used as an alignment mark.

Since the trench capacitor 118b and the conductive layers 120b and 124b are formed in the deep trench 110b, the step height of the substrate 100 on the alignment mark region 20 is reduced, lowering the image contrast of the alignment mark.

Accordingly, in FIG. 1d, a patterned photoresist layer (not shown) is formed on the masking layer 105 by lithography to completely cover the deep trench 110a and expose the deep trench 110b only. Thereafter, the conductive layer 124b is completely removed and then the underlying conductive layer 120b and the collar insulating layer 117b are partially removed by etching using the patterned photoresist layer as a mask to leave a portion of the conductive layer 120c and the collar insulating layer 117c, thereby increasing the step height of the substrate 100 on the alignment mark region 20. However, such a process is complex, thus increasing fabrication cost and the time required thereby.

SUMMARY OF THE INVENTION

Accordingly, an object of the present invention is to provide a novel process for integrating an alignment mark and a trench device, thereby simplifying the process to reduce fabrication cost and time and increase throughput.

According to the object of the invention, a process for integrating an alignment mark and a trench device are provided. First, a substrate having first and second trenches is provided, wherein the second trench used as the alignment mark is wider than the first trench. Next, the trench device is formed in each of the low portions of the first and second trenches, and then a first conductive layer is formed on the trench device in each of the first and second trenches. Thereafter, a second conductive layer is formed overlying the substrate filling in the first trench and is simultaneously and conformably formed over the inner surface of the second trench. Finally, the second conductive layer and a portion of the first conductive layer in the second trench are removed and simultaneously leave a portion of the second conductive layer in the first trench by an etch back process, wherein the etch back process employs chemical mechanic polishing to remove the second conductive layer overlying the substrate.

Moreover, the first and second conductive layers can be a polysilicon layer, which have a thickness of about 2000Å to 4000Å.

DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

A preferred embodiment of the present invention is now described with reference to FIGS. 2a to 2f. First, in FIG. 2a, a substrate 200, such as a silicon wafer, is provided. The substrate 200 has a device region 30 and an alignment mark region 40 which is at the scribe line of the wafer 200.

Figure 1A:
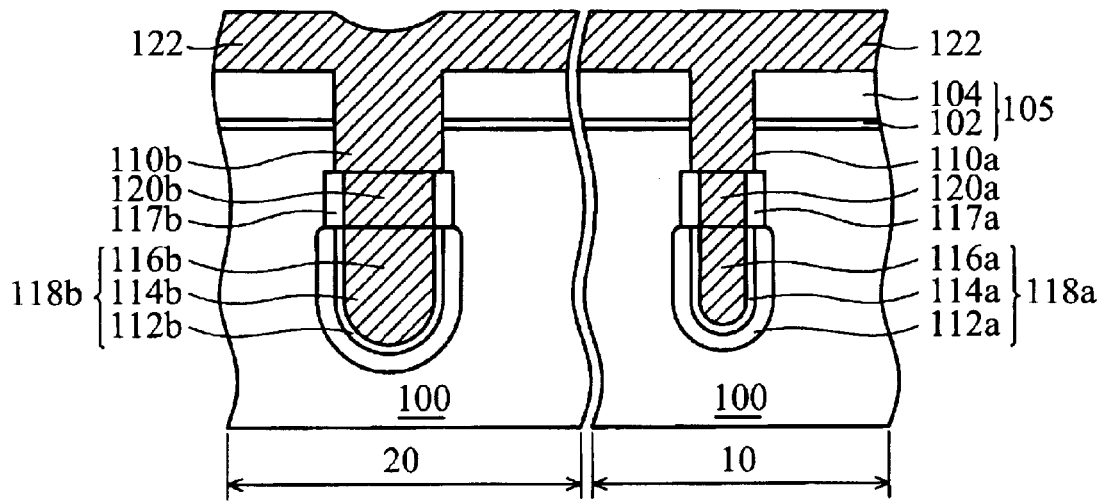
FIGS. 1a to 1d are cross-sections showing a conventional process for integrating an alignment mark and a trench device.
Figure 1B:
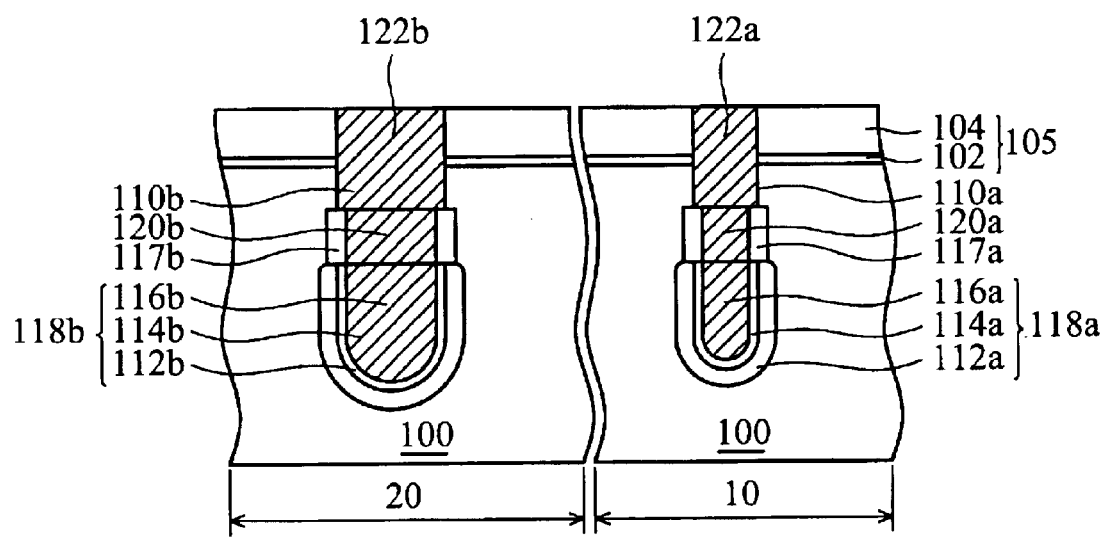
Figure 1C:
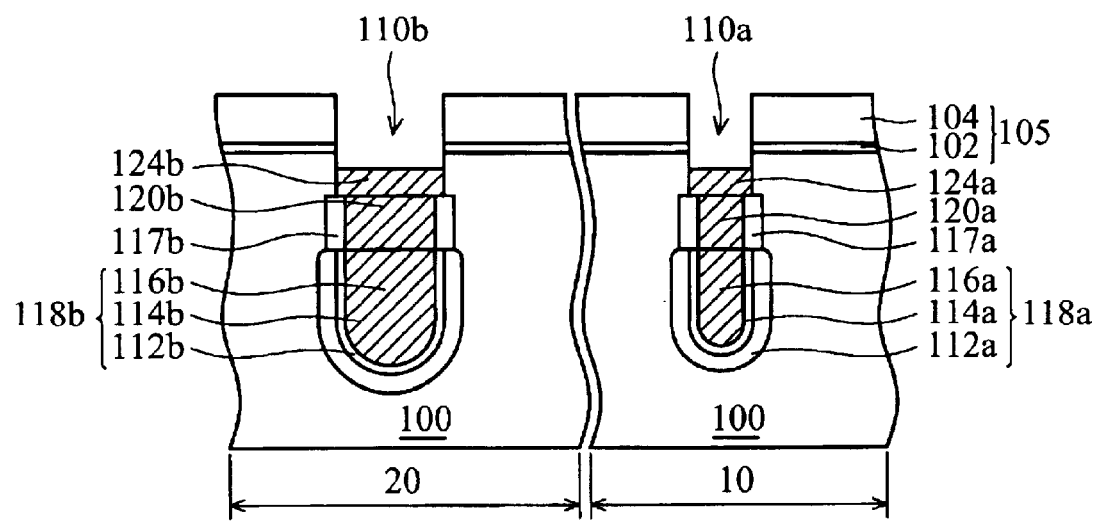
Figure 1D:
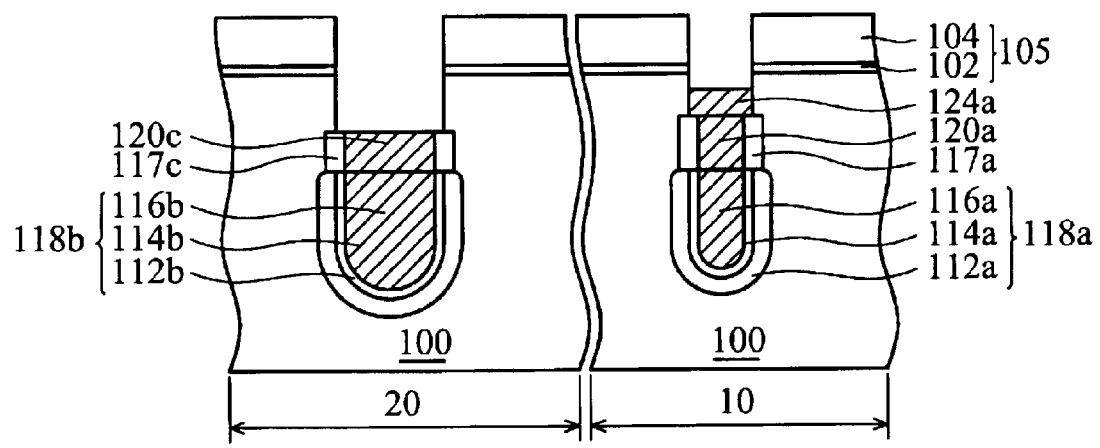
Figure 2A:
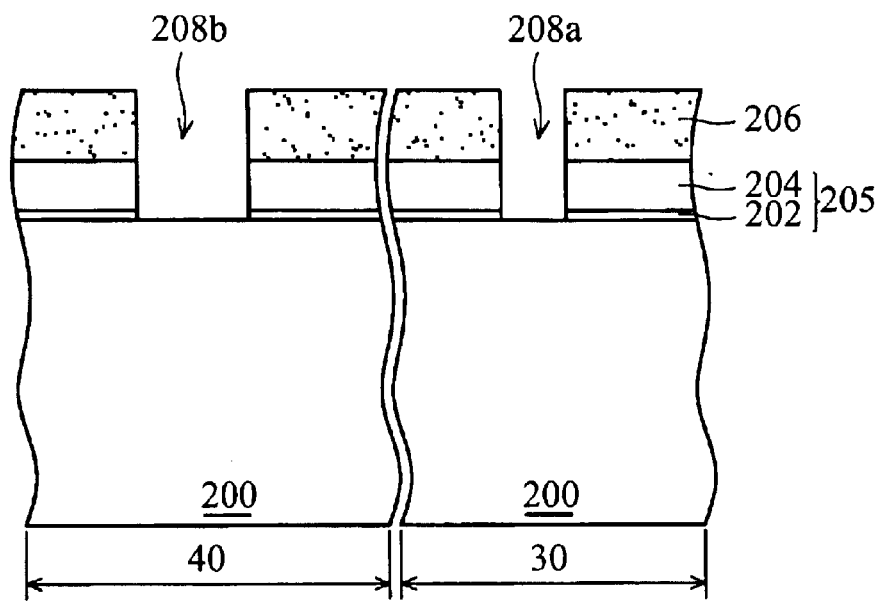
FIGS. 2a to 2f are cross-sections showing a process for integrating an alignment mark and a trench device according to the invention.

Next, a masking layer 205 is formed on the substrate 200. As shown in FIG. 2a, the masking layer 205 can be composed of a pad oxide layer 202 and a thicker overlying silicon nitride layer 204. In this invention, the pad oxide layer 202 has a thickness of about 100Å and can be formed by thermal oxidation or conventional CVD, such as atmospheric pressure CVD (APCVD) or low pressure CVD (LPCVD). Moreover, the silicon nitride layer 204 overlying the pad oxide layer 202 has a thickness of about 1000~2000Å and can be formed by LPCVD using $SiCl_2H_2$ and $NH_3$ as reaction sources.

Next, a photoresist layer 206 is coated on the masking layer 205, and then the photoresist layer 206 is patterned by lithography to form openings 208a and 208b therein. The opening 208a is in the device region 30 and the opening 208b having a width larger than the opening 208a is in the alignment mark region 40. Next, the masking layer 205 is anisotropically etched by, for example, reactive ion etching (RIE), using the patterned photoresist layer 206 as an etch mask to transfer the opening patterns 208a and 208b into the masking layer 205 and thus expose a portion of the substrate 200.

Figure 2B:
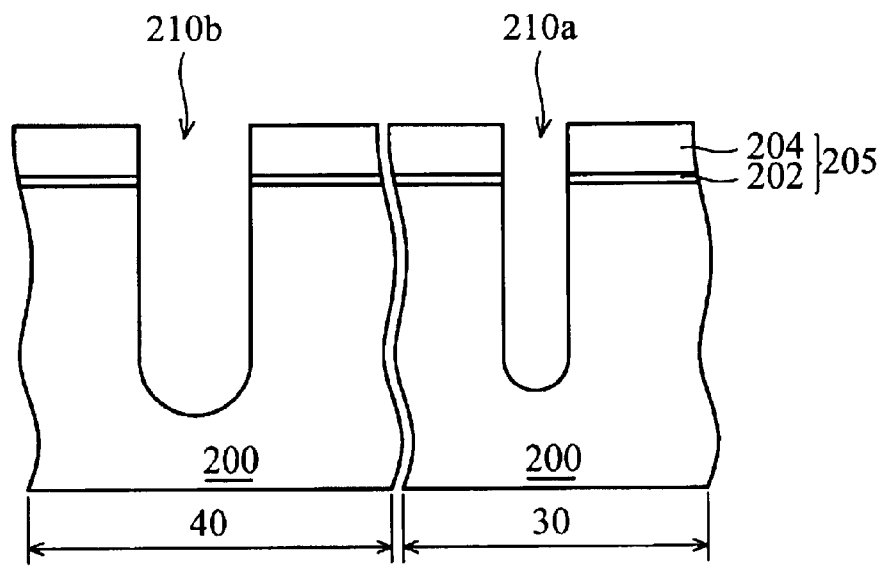

Next, in FIG. 2b, the patterned photoresist layer 206 is removed by a suitable wet chemical etching or ashing technique. Anisotropic etching, for example, RIE, is subsequently performed using the masking layer 205 as an etch mask. The silicon substrate 200 under these openings is etched to form deep trenches 210a and 210b having a predetermined depth in the silicon substrate 200. Also, the deep trench 210a is in the device region 30 and the trench 210b having a width larger than the deep trench 210a is on the alignment mark region 40.

Figure 2C:
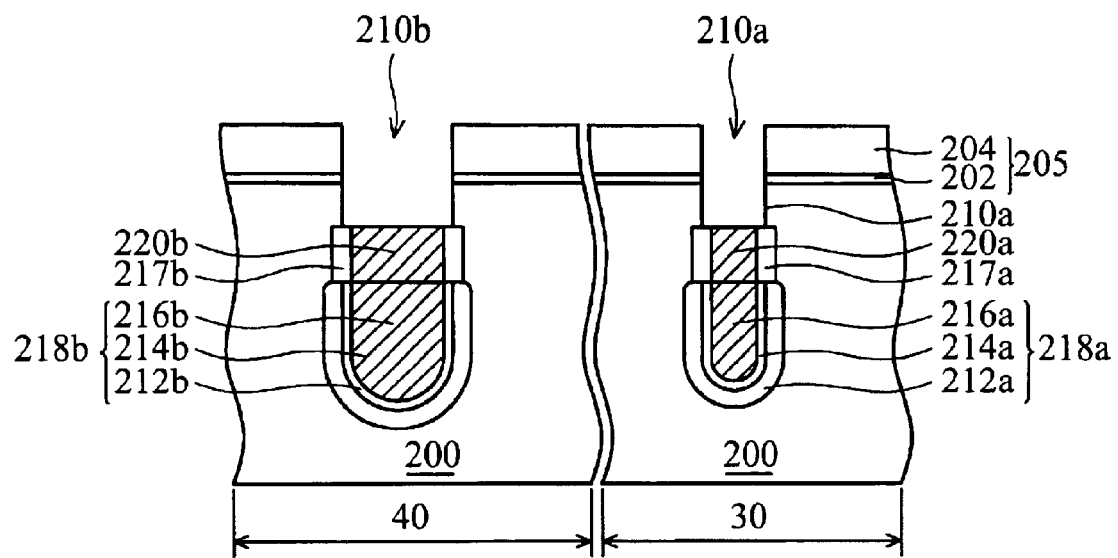

Next, in FIG. 2c, trench devices 218a and 218b are respectively formed in the lower portion of the deep trenches 210a and 210b. In the invention, the trench devices 218a and 218b can be a trench capacitor. The trench capacitor 218a includes a top plate 216a, a capacitor dielectric layer 214a, and a bottom plate 212a. Also, the trench capacitor 218b includes a top plate 216b, a capacitor dielectric layer 214b, and a bottom plate 212b. The bottom plates 212a and 212b are formed in the substrate 200 around the lower portion of the trenches 210a and 210b, respectively. The top plates 216a and 216b which can be composed of polysilicon are disposed in the lower portion of the deep trenches 210a and 210b, respectively. The capacitor dielectric layer 214a and 214b are respectively disposed between the bottom plates 212a and 212b and the top plates 216a and 216b.

Next, collar insulating layers 217a and 217b, such as silicon oxides, are respectively formed on the trench capacitors 218a and 218b and over the sidewall of the trenches 210a and 210b. Thereafter, a conductive layer (not shown), such as polysilicon, is formed on the masking layer 205 and fills in the deep trenches 210a and 210b by conventional deposition, such as CVD. A portion of the conductive layers 220a and 220b is left in the deep trenches 210a and 210b, respectively, by an etch back process. The height of the remaining conductive layers 220a and 220b are substantially equal to the collar insulating layers 217a and 217b which have a height of about 2000Å to 4000Å.

Figure 2D:
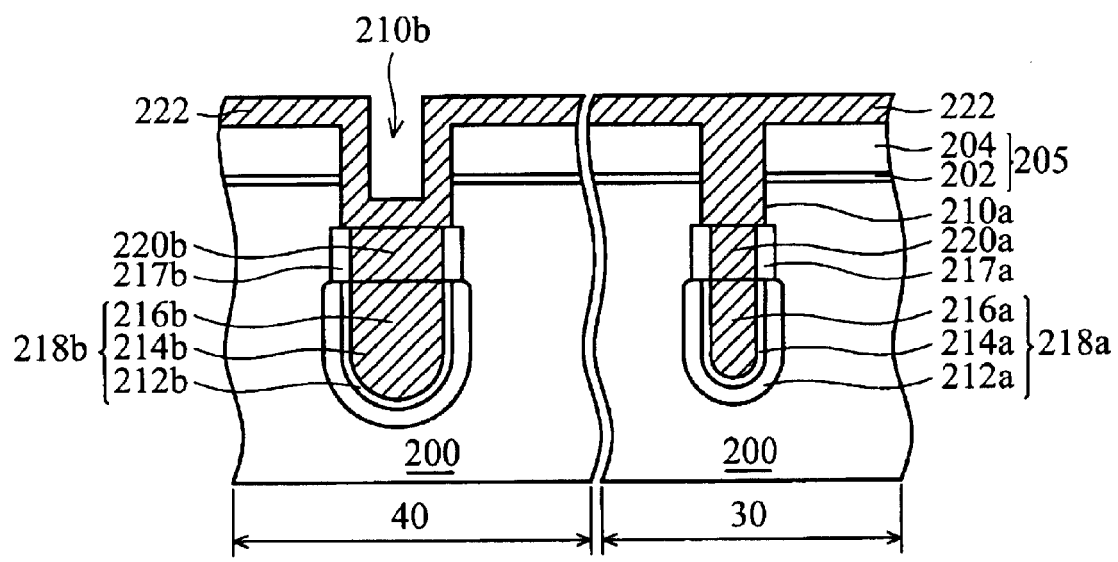
Figure 2E:
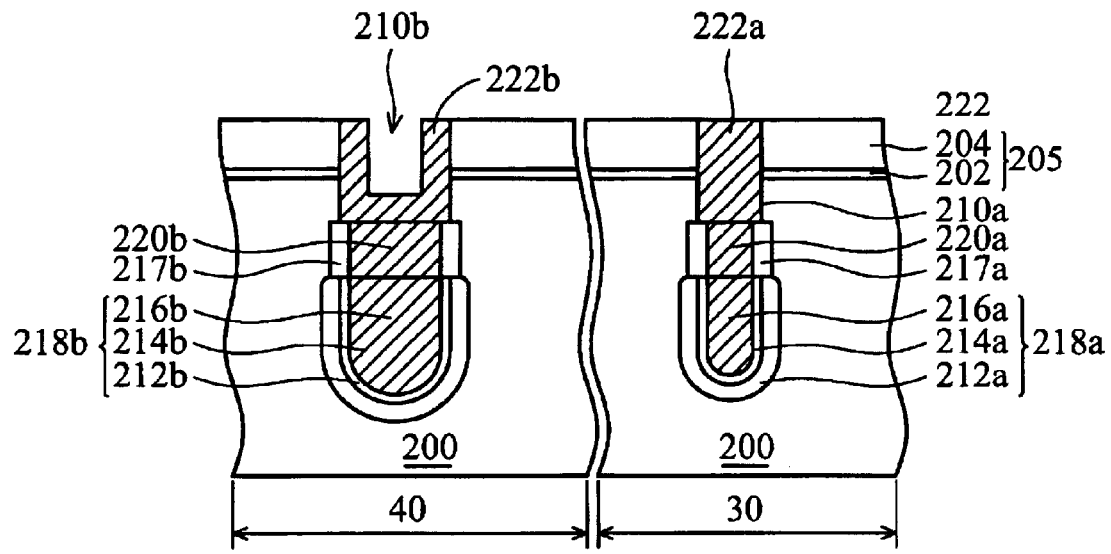
Figure 2F:
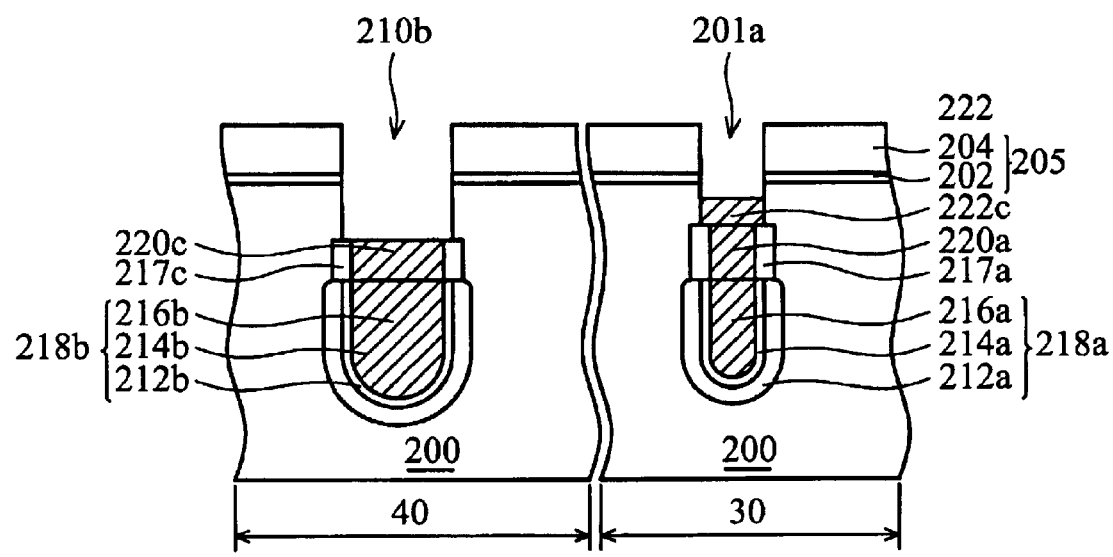

FIGS. 2d to 2f are cross-sections showing the critical step of the invention. In FIG. 2d, a conductive layer 222, such as polysilicon layer, is formed on the masking layer 205 and fills in the deep trench 210a on the device region 30. At the same time, the conductive layer 222 is also conformably formed on the masking layer 205 and the inner surface of the deep trench 210b on the alignment mark region 40. Here, the conductive layer 222 has a thickness of about 2000Å to 4000Å.

Next, in FIG. 2e, chemical mechanical polishing (CMP) is performed on the conductive layer 222 using the masking layer 205 as a stop layer to leave a portion of the conductive layer 222a and 222b in the deep trenches 210a and 210b, respectively.

Finally, in FIG. 2f, the remaining conductive layers 222a and 222b are etched by isotropic etching, such as wet chemical etching. In this etch back process, the remaining conductive layer 222b on the alignment mark region 40 is completely removed and a portion of the conductive layer 220b and the collar insulating layer 217b is then removed to leave a portion of the conductive layer 220c and the collar insulating layer 217c, thus completing fabrication of the alignment mark. Here, the conductive layer 220b is completely removed to increase the step height of the substrate 200 on the alignment mark region 40, thereby increasing image contrast for lithography. At the same time, in this etch back process, the remaining conductive layer 222a on the device region 30 is partially removed to leave a portion of the conductive layer 222c. The remaining conductive layer 222c and the conductive layer 220a serve as a wiring layer for the trench capacitor 218a.

In addition, it is noted that since the conductive layer 222 is conformably formed over the inner surface, but does not completely fill the deep trench 210b, isotropic etching can be performed without previous CMP to further simplify the fabrication process.

According to the invention, the conductive layer 222 on the alignment mark 40 can be completely removed by the isotropic etching. Compared with the prior art wherein etching is performed at least twice and lithography is performed at least once to completely remove the conductive layer 222, fabrication cost and time can be reduced through the simplified process of the invention, thereby increasing throughput.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A process for integrating an alignment mark and a trench device, comprising the steps of:

providing a substrate having a device region and an alignment mark region;

forming a first trench in the device region and a second trench in the alignment mark region, wherein the second trench has a width larger than the first trench;

forming a trench capacitor in each of the low portion of the first and second trenches;

forming a first polysilicon layer on the trench capacitor in each of the first and second trenches;

forming a second polysilicon layer overlying the substrate and filling in the first trench and simultaneously and conformably forming the second polysilicon layer over the inner surface of the second trench; and removing the second polysilicon layer and a portion of the first polysilicon layer on the alignment mark region and simultaneously leaving a portion of the second polysilicon layer in the first trench on the device region by an etch back process.

2. The process as claimed in claim 1, wherein the substrate is a silicon wafer and the alignment mark region is at the scribe line of the wafer.

3. The process as claimed in claim 1, wherein the trench capacitor comprises:
   a bottom electrode formed in the substrate around each of the lower portions of the first and second trenches;
   a top electrode disposed in each of the lower portion of the first and second trenches; and
   a capacitor dielectric layer disposed between the bottom and top electrodes.

4. The process as claimed in claim 1, wherein the first polysilicon layer has a thickness of about 2000 Å to 4000 Å.

5. The process as claimed in claim 1, wherein the second polysilicon layer has a thickness of about 2000 Å to 4000 Å.

6. The process as claimed in claim 1, wherein the etch back process comprises a polishing treatment to remove the second polysilicon layer overlying the substrate.

7. The process as claimed in claim 6, wherein the polishing treatment is chemical mechanical polishing.

8. A process for integrating an alignment mark and a trench device, comprising the steps of:
   providing a substrate having a first trench and a second trench, wherein the second trench serves as the alignment mark and has a width larger than the first trench;
   forming the trench device in each of the low portions of the first and second trenches;
   forming a first conductive layer on the trench device in each of the first and second trenches;
   forming a second conductive layer overlying the substrate and filling in the first trench and simultaneously and conformably forming the second conductive layer over the inner surface of the second trench; and
   removing the second conductive layer and a portion of the first conductive layer in the second trench and simultaneously leaving a portion of the second conductive layer in the first trench by an etch back process.

9. The process as claimed in claim 8, wherein the substrate is a silicon substrate.

10. The process as claimed in claim 8, wherein the trench device is a trench capacitor.

11. The process as claimed in claim 10, wherein the trench capacitor comprises:
   a bottom electrode formed in the substrate around each of the lower portion of the first and second trenches;
   a top electrode disposed in each of the lower portions of the first and second trenches; and
   a capacitor dielectric layer disposed between the top and bottom electrodes.

12. The process as claimed in claim 8, wherein the first conductive layer is a polysilicon layer.

13. The process as claimed in claim 12, wherein the first conductive layer has a thickness of about 2000 Å to 4000 Å.

14. The process as claimed in claim 8, wherein the second conductive layer is a polysilicon layer.

15. The process as claimed in claim 8, wherein the second conductive layer has a thickness of about 2000 Å to 4000 Å.

16. The process as claimed in claim 8, wherein the etch back process comprises a polishing treatment to remove the second conductive layer overlying the substrate.

17. The process as claimed in claim 16, wherein the polishing treatment is chemical mechanical polishing.

* * * * *